(12) United States Patent
Dutta et al.

(10) Patent No.: US 11,502,242 B2
(45) Date of Patent: Nov. 15, 2022

(54) EMBEDDED MEMORY DEVICES

(71) Applicant: INTERNATIONAL BUSINESS MACHINES CORPORATION, Armonk, NY (US)

(72) Inventors: Ashim Dutta, Menands, NY (US); Chih-Chao Yang, Glenmont, NY (US); Michael Rizzolo, Delmar, NY (US); Theodorus E. Standaert, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 365 days.

(21) Appl. No.: 16/828,489

(22) Filed: Mar. 24, 2020

(65) Prior Publication Data

US 2021/0305494 A1  Sep. 30, 2021

(51) Int. Cl.
*H01L 43/02* (2006.01)
*H01L 43/12* (2006.01)
*H01F 41/34* (2006.01)
*G11C 11/16* (2006.01)
*H01F 10/32* (2006.01)

(52) U.S. Cl.
CPC ............ *H01L 43/02* (2013.01); *G11C 11/161* (2013.01); *H01F 41/34* (2013.01); *H01L 43/12* (2013.01); *H01F 10/3259* (2013.01)

(58) Field of Classification Search
CPC ....... H01L 43/02; H01L 43/12; G11C 11/161; H01F 10/3259; H01F 41/34
USPC ....................................................... 257/421
See application file for complete search history.

(56) References Cited

U.S. PATENT DOCUMENTS

| | | |
|---|---|---|
| 8,129,268 B2 | 3/2012 | Breitwisch |
| 9,343,659 B1 | 3/2016 | Lu et al. |
| 9,406,875 B2 | 8/2016 | Li et al. |
| 9,553,128 B1 | 1/2017 | Annunziata et al. |
| 9,564,582 B2 | 2/2017 | Pakala et al. |
| 9,780,301 B1 | 10/2017 | Chuang et al. |
| 2010/0019215 A1 | 1/2010 | Lung et al. |

(Continued)

OTHER PUBLICATIONS

Song et al., "Highly Functional and Reliable 8Mb STT-MRAM Embedded in 28nm Logic", 2016 IEEE International Electron Devices Meeting. Dec. 3, 2016. pp. 27.2.1-27.2.4.

*Primary Examiner* — Jami Valentine Miller
(74) *Attorney, Agent, or Firm* — Tutunjian & Bitetto, P.C.; L. Jeffrey Kelly

(57) ABSTRACT

A semiconductor device includes a base structure of an embedded memory device including a bottom electrode contact (BEC) landing pad within a memory area of the embedded memory device and a first metallization level having at least a first conductive line within a logic area of the embedded memory device, a cap layer disposed on the base structure, a BEC disposed through the cap layer on the BEC landing pad, a memory pillar disposed on the BEC and the cap layer, encapsulation layers encapsulating the memory pillar to protect the memory stack, and a second metallization level including a second conductive line surrounding the top electrode, a via disposed on the first conductive line such that the second via is below the top electrode, and a third conductive line disposed on the via to enable the memory pillar to be fitted between the first and second metallization levels.

20 Claims, 7 Drawing Sheets

(56) References Cited

U.S. PATENT DOCUMENTS

2013/0119494 A1     5/2013  Li et al.
2016/0365505 A1    12/2016  Lu et al.
2020/0403032 A1*   12/2020  Dutta .................... H01L 43/08
2021/0193920 A1*    6/2021  Ando .................. H01L 45/1233

* cited by examiner

US 11,502,242 B2

1

EMBEDDED MEMORY DEVICES

BACKGROUND

The present invention generally relates to semiconductor devices, and more particularly to memory devices embedded in back-end-of-line (BEOL) interconnect structures.

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. Examples of non-volatile memory devices include magnetoresistive (MRAM), resistive RAM (ReRAM) and phase-change RAM (PCRAM).

SUMMARY

In accordance with an embodiment of the present invention, a method for fabricating a semiconductor device is provided. The method includes forming a bottom electrode contact (BEC) on a BEC landing pad of a base structure of an embedded memory device. The base structure further includes a first metallization level. The method further includes forming, on the BEC, a memory pillar including a bottom electrode, a memory stack and a top electrode, encapsulating the memory pillar with encapsulation layers to protect the memory stack, and surrounding the top electrode within a second conductive line during formation of a second metallization level to enable the memory pillar to be fitted between the first and second metallization levels.

In accordance with another embodiment of the present invention, a method for fabricating a semiconductor device is provided. The method includes forming a cap layer across a base structure of an embedded memory device. The base structure includes a bottom electrode contact (BEC) landing pad within a memory area of the embedded memory device and a first metallization level having a first conductive line within a logic area of the embedded memory device. The method further includes forming a bottom electrode contact (BEC) through the cap layer on the BEC landing pad, forming, on the BEC and the cap layer, a memory pillar including a bottom electrode, a memory stack and a top electrode, encapsulating the memory pillar with encapsulation layers to protect the memory stack, obtaining a patterned interlevel dielectric (ILD) layer including a plurality of trenches and a via opening, and filling the plurality of trenches and the via opening with conductive material to form a second metallization level including a second conductive line surrounding the top electrode, a via disposed on the first conductive line such that the via is below the top electrode, and a second conductive line disposed on the first conductive line to enable the memory pillar to be fitted between the first and second metallization levels.

In accordance with yet another embodiment of the present invention, a semiconductor device is provided. The device includes a base structure of an embedded memory device including a bottom electrode contact (BEC) landing pad within a memory area of the embedded memory device and a first metallization level having at least a first conductive line within a logic area of the embedded memory device, a cap layer disposed on the base structure, the cap layer including a flat portion within the logic area and a sloped portion with the memory area, a BEC disposed through the cap layer on the BEC landing pad, a memory pillar disposed on the BEC and the cap layer including a bottom electrode, a memory stack and a top electrode, encapsulation layers encapsulating the memory pillar to protect the memory stack, and a second metallization level including a second conductive line surrounding the top electrode, a via disposed on the first conductive line such that the second via is below the top electrode, and a third conductive line disposed on the via to enable the memory pillar to be fitted between the first and second metallization levels.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
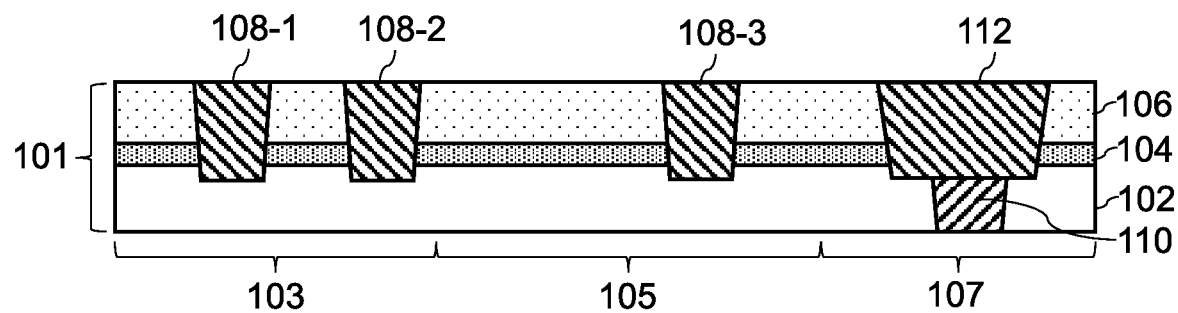
FIG. 1 is a cross-sectional view of a base structure of an embedded memory device formed during fabrication of a semiconductor device, in accordance with an embodiment of the present invention.

The embodiments described herein provide for the formation of an embedded memory device (e.g., an embedded MRAM device) including a memory pillar and a bottom electrode, in which the memory pillar along the bottom electrode has a height greater than the distance or spacing between bottom and top conductive lines of the memory device. In other words, the memory pillar has a height greater than the via connecting the bottom and top conductive lines. The entire memory pillar can be fitted between the bottom and top conductive lines by having a portion of the memory pillar protrude into the top conductive line. Memory pillar encapsulation can prevent the top conductive line from reaching the memory stack (e.g., MTJ stack). The top conductive line can contact the top electrode of the embedded memory device at the sidewall and part of the memory pillar can penetrate into the top conductive line. The memory device described herein can include a logic area, a memory area, and a logic to memory boundary therebetween. The thickness of the dielectric cap in a logic area can be varied within the logic area. Accordingly, the embodiments described herein can accommodate memory pillars having taller bottom electrodes without needing to recess or etch conductive lines.

An embedded memory device in accordance with the embodiments described herein can be formed by patterning a memory pillar (e.g., MRAM pillar) using ion beam etching (IBE) and forming an encapsulation around the memory pillar, depositing an interlevel dielectric (ILD) layer in which a top conductive line is to be formed, and forming trenches for the top conductive line by etching the ILD around the encapsulation adjacent the memory pillar. Selectivity of the dielectric etch to the encapsulation material can help form the trench without exposing the memory stack. Accordingly, the embodiments described herein can address concerns of gouging of dielectric material underneath a bottom electrode of an embedded memory device can occur during etching of a memory stack, which increases dielectric cap thickness and the total height of a memory pillar and makes it more difficult to fit the entire memory pillar between a bottom conductive line and a top conductive line in advanced complementary metal-oxide semiconductor (CMOS) technology nodes.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

With reference to FIG. 1, a cross-sectional view of a semiconductor device 100 including an embedded memory device is provided. In one embodiment, the embedded memory device includes an embedded random-access memory (RAM) device. In this illustrative example, an embedded magnetoresistive RAM (MRAM) device is shown. However, the device 100 can include any suitable memory device technology in accordance with the embodiments described herein.

As shown, the device 100 can have a plurality of areas or regions. More specifically, the device can include a logic area 103, a logic to memory boundary area 105, and a memory area 107. The device 100 further includes a base structure 101. The base structure 101 can include a dielectric substrate 102, a cap layer 104 and an interlevel dielectric (ILD) layer 106.

Any suitable material can be used to form the dielectric substrate 102 in accordance with the embodiments described herein. For example, the dielectric substrate 102 can include an oxide. Examples of materials that can be used to form the ILD layer 106 include, but are not limited to, low-k dielectric materials, tetraethyl orthosilicate (TEOS) based oxides, etc.

A low-k dielectric material is a material with a dielectric constant k less than the dielectric constant of $SiO_2$ at room temperature (e.g., about 20° C.-25° C.) and atmospheric pressure (e.g., about 1 atm). For example, a low-k dielectric material can have a dielectric constant of less than about 3.9. In one embodiment, the dielectric substrate 102 can include an ultra-low k (ULK) dielectric material having a dielectric constant less than or equal to, e.g., about 2.5. The dielectric substrate 102 can be formed using any suitable process in accordance with the embodiments described herein.

Any suitable material can be used to form the cap layer 104 in accordance with the embodiments described herein. Examples of materials that can be used to form the cap layer 104 include, but are not limited to, silicon (Si)-based oxides, Si-based nitrides, etc., which can include other elements such as, e.g., C, N, O, etc. For example, the cap layer 104 can include, e.g., silicon nitride (e.g., SiN), silicon carbonitride (e.g., SiCN), silicon oxynitride (e.g., SiNO), silicon carbide (e.g., SiC), etc.

Any suitable material can be used to form the ILD layer 106 in accordance with the embodiments described herein. Examples of materials that can be used to form the ILD layer 106 include, but are not limited to, low-k dielectric materials. More specifically, the ILD layer 106 can include, e.g., a ULK material.

The base structure 101 further includes conductive lines 108-1 through 108-3 formed through the ILD layer 106 and the cap layer 104 to a height within the dielectric substrate. More specifically, the conductive lines 108-1 and 108-2 are formed within the logic area 103, and the conductive line 108-3 is formed within the logic to memory boundary area 105. The conductive lines 108-1 through 108-3 are included within a first metallization level of the device 100.

Any suitable material can be used to form the conductive lines 108-1 and 108-2 in accordance with the embodiments described herein. Examples of materials that can be used to form the conductive lines 108-1 and 108-2 include, but are not limited to, copper (Cu), cobalt (Co), tungsten (W), ruthenium (Ru), aluminum (Al), etc.

The base structure 101 further includes, within the memory area 107, contact 110 embedded in the dielectric substrate 102 to a height within the dielectric substrate 102, and a bottom electrode contact (BEC) landing pad 112 disposed on the contact 110 to the upper surface of the ILD layer 106. The contact 110 connects BEC landing pad 112 to the underlying interconnect structure (e.g., middle-of-the-line (MOL) interconnect structure) or front-end-of-the-line (FEOL) devices such as, e.g., a transistor for switching memory devices.

Any suitable material can be used to form the contact 110 in accordance with the embodiments described herein. Examples of materials that can be used to form the contact 110 include, but are not limited to, copper (Cu), cobalt (Co), tungsten (W), ruthenium (Ru), aluminum (Al), etc.

Although not shown, the contact 110 can include a barrier layer. Examples of materials that can be used to form the barrier layer include, but are not limited to, tantalum nitride (TaN), titanium nitride (TiN), etc.

Any suitable material can be used to form the BEC landing pad 112 in accordance with the embodiments described herein. Examples of materials that can be used to form the BEC landing pad 112 include, but are not limited to, copper (Cu), cobalt (Co), tungsten (W), ruthenium (Ru), aluminum (Al), etc.

Figure 2:
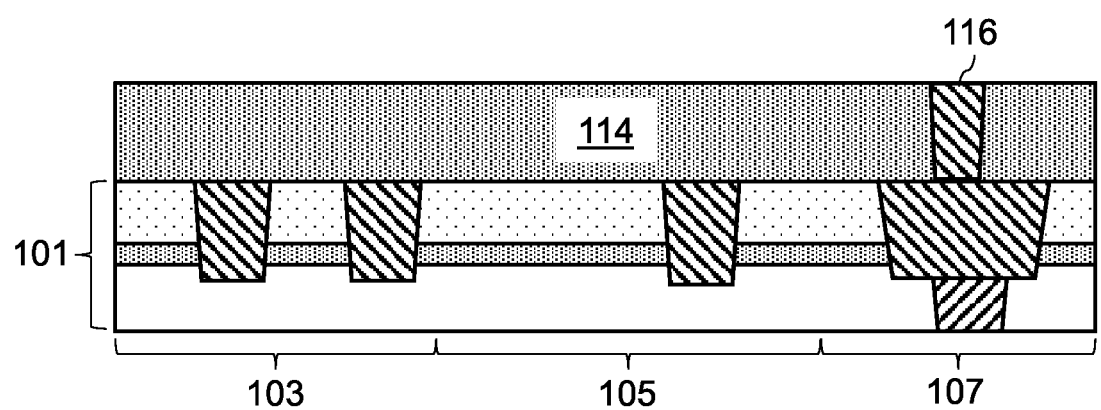
FIG. 2 is a cross-sectional view of a cap layer and via formed on the base structure during the fabrication of the semiconductor device, in accordance with another embodiment of the present invention.

With reference to FIG. 2, a cap layer 114 is formed across the base structure 101, and a bottom electrode contact (BEC) 116 is formed to contact the BEC landing pad 112 through the cap layer 114. Any suitable process can be used to form the cap layer 114 and the via 116 in accordance with the embodiments described herein.

Any suitable material can be used to form the cap layer 114 in accordance with the embodiments described herein. Examples of materials that can be used to form the cap layer 114 include, but are not limited to, silicon (Si)-based oxides, Si-based nitrides, etc., which can include other elements such as, e.g., C, N, O, etc. For example, the cap layer 114 can include, e.g., silicon nitride (e.g., SiN), silicon carbonitride (e.g., SiCN), silicon oxynitride (e.g., SiNO), silicon carbide (e.g., SiC), etc.

Any suitable material can be used to form the BEC 116 in accordance with the embodiments described herein. Examples of materials that can be used to form the via BEC include, but are not limited to, copper (Cu), cobalt (Co), tungsten (W), ruthenium (Ru), aluminum (Al), etc.

Figure 3:
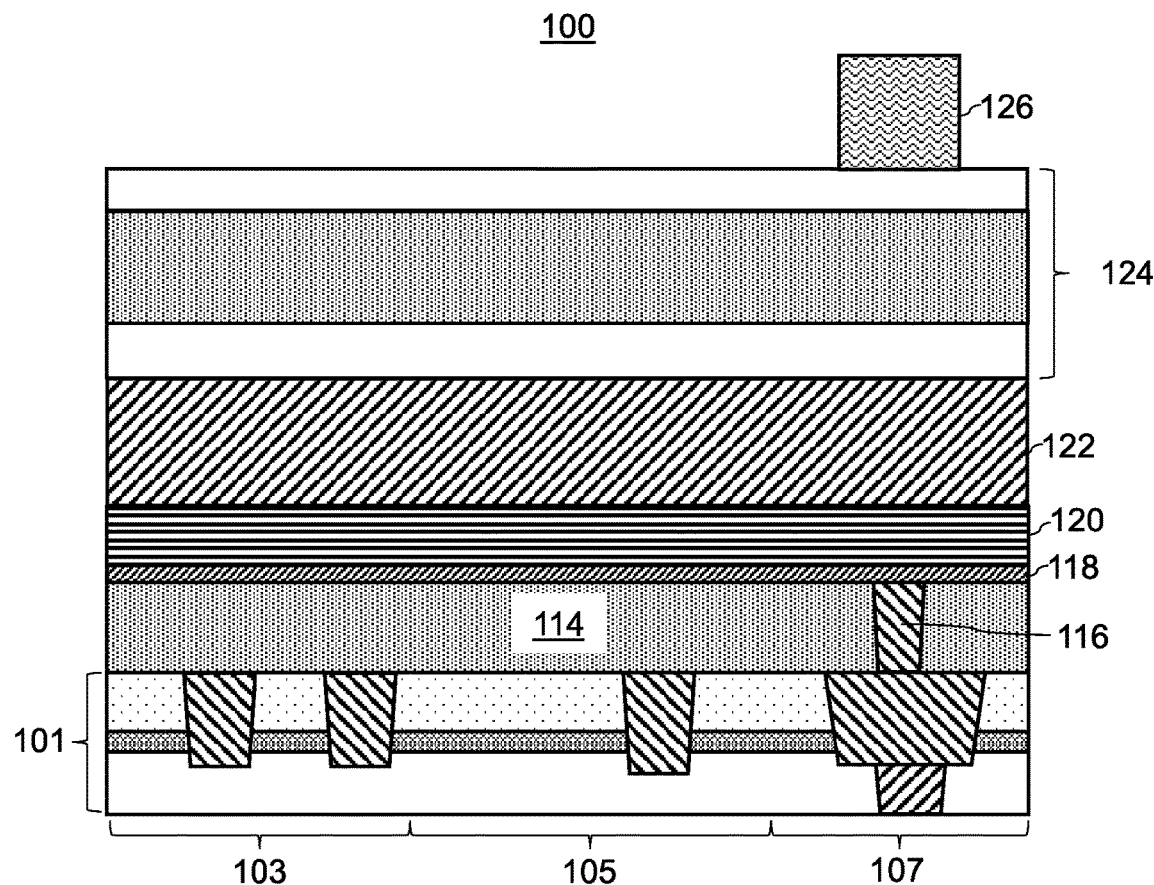
FIG. 3 is a cross-sectional view of the formation of a plurality of layers including bottom electrode contact (BEC) material, a memory material stack, top electrode material, a lithography stack and a block mask during the fabrication of a semiconductor device, in accordance with an embodiment of the present invention.

With reference to FIG. 3, a plurality of layers is formed on the cap layer 114 and the BEC 116. More specially, bottom electrode material 118 is formed on the cap layer 114 and the BEC 116, a memory material stack 120 is formed on the bottom electrode material 118, top electrode material 122 is formed on the memory material stack 120, a lithography stack 124 is formed on the top electrode material 122, and a photoresist pattern 126 is formed on the lithography stack.

The bottom electrode material 118 can include any suitable material in accordance with the embodiments described herein. Examples of materials that can be used to form the bottom electrode material 118 include, but are not limited to, tantalum nitride (TaN), titanium nitride (TiN), etc.

In one embodiment, the memory material stack 120 includes a magnetic tunnel junction material (MTJ) stack. For example, in this embodiment, the memory material stack 120 can include seed layer, fixed magnetic layers, free magnetic layers, tunnel barrier(s), oxide cap(s), etc. The tunnel barrier should be sufficiently thin to allow for electrons to tunnel from one ferromagnet into the other in accordance with tunnel magnetoresistance (TMR). For example, the tunnel barrier can have a thickness of, e.g., about a few nanometers. A tunnel barrier can include any suitable insulator material in accordance with the embodiments described herein. Examples of suitable insulator materials include, but are not limited to, magnesium oxide (MgO) and aluminum oxide ($Al_2O_3$). The memory material stack 120 can be fabricated using one or more thin film technology processes. For example, memory material stack 120 can be fabricated using one or more of, e.g., sputter deposition, molecular beam epitaxy, pulsed laser deposition, and any type of physical vapor deposition (PVD).

The top electrode material 122 can include any suitable material in accordance with the embodiments described herein. Examples of materials that can be used to form the top electrode material 122 include, but are not limited to, Nb, NbN, W, WN, Ta, TaN, Ti, TiN, Ru, Mo, Cr, V, Pd, Pt, Rh, Sc, Al, Cu, and other high melting point metals or conductive nitrides.

The lithography stack 124 and the photoresist pattern 126 will be used to form a memory pillar from the memory stack 120, as will be described in further detail below with reference to FIG. 4. For example, the lithography stack 124 can include, e.g., a resist layer, an organic planarization layer (OPL) and an antireflective coating (ARC) layer, and the photoresist pattern 126 can include, e.g., a dielectric hardmask.

Figure 4:
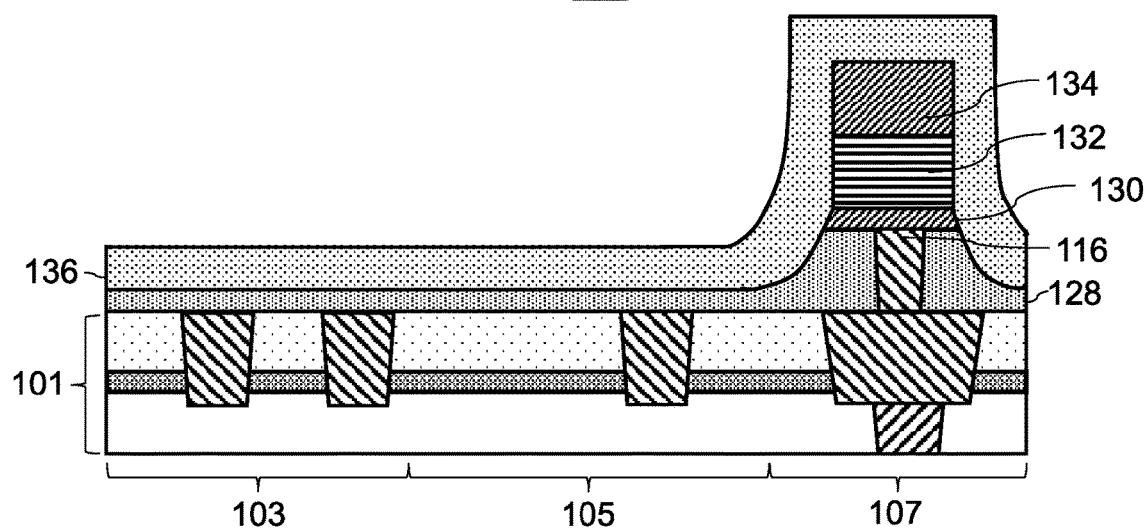
FIG. 4 is a cross-sectional view of the patterning of the plurality of layers to form a memory pillar, and the formation of encapsulation layer material along the patterned cap layer and the memory pillar during the fabrication of the semiconductor device, in accordance with an embodiment of the present invention.

With reference to FIG. 4, patterning is performed using the lithography stack 124 and the photoresist pattern 126 to form a patterned cap layer 128 from the cap layer 114, a bottom electrode 130 from the bottom electrode material 118, a memory stack (e.g., MTJ stack) 132 from the memory material stack 120 and a top electrode 134 from the top electrode material 122. The patterned cap layer 128 is flat within the areas 103 and 105, and is sloped in the memory area 107. Any suitable patterning process can be used in accordance with the embodiments described herein. For example, reactive-ion etching (RIE) and/or ion beam etching (IBE) can be used.

The components 130 through 134 can collectively be referred to as a memory pillar. For example, in the embodiment in which the device 100 includes an MRAM device, the memory pillar is an MRAM pillar. In order to avoid sputtering from the BEC 116 and redeposition on the memory pillar sidewall during IBE, the critical dimension of the bottom electrode 130 can be larger than the top critical dimension of the BEC 116.

After the patterning is performed, encapsulation layer material 136 is formed on the patterned cap layer 128 and the memory pillar. More specifically, the encapsulation layer material 136 can be conformally deposited across the patterned cap layer 128 and the memory pillar. As will be described in further detail below with reference to FIG. 5, the encapsulation layer material 136 will be etched back to form encapsulation layers. The encapsulation layer material 136 can include any suitable material in accordance with the embodiments described herein. Examples of materials that can be used to form the encapsulation layer material 136 include, but are not limited to, silicon nitride (e.g., SiN), silicon carbonitride (e.g., SiCN), silicon oxynitride (e.g., SiNO), silicon carbide (e.g., SiC), etc.

Figure 5:
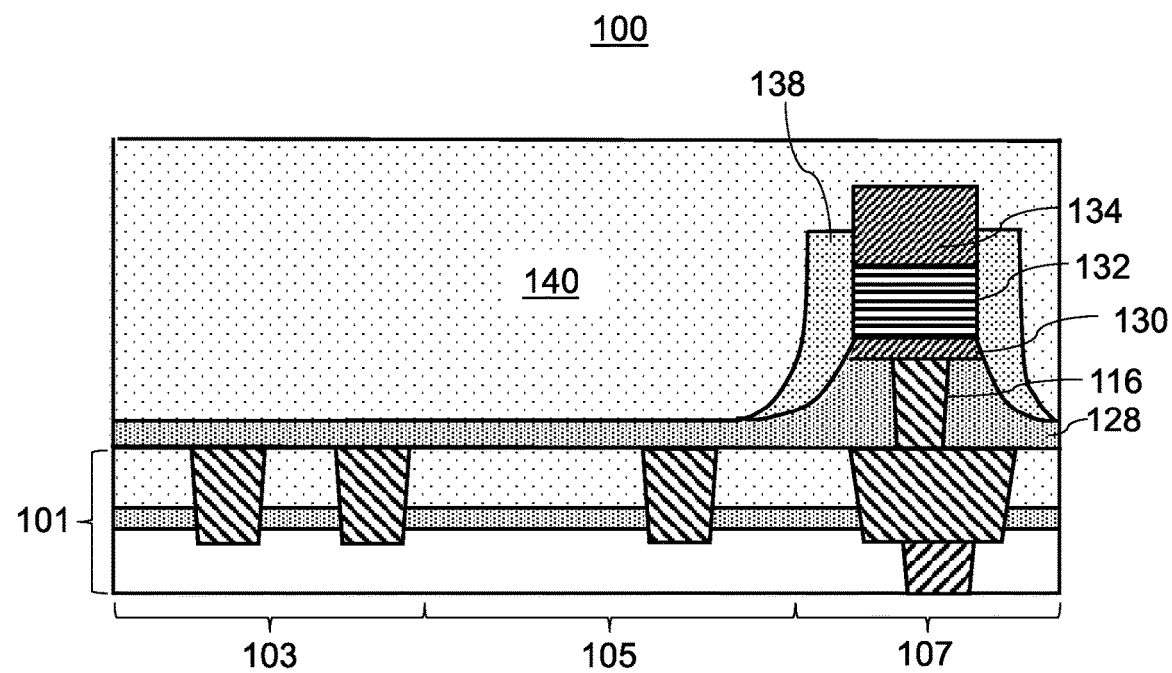
FIG. 5 is a cross-sectional view of the formation of encapsulation layers from the encapsulation layer material and an interlevel dielectric (ILD) layer during the fabrication of the semiconductor device, in accordance with an embodiment of the present invention.

With reference to FIG. 5, encapsulation layers 138 are formed to encapsulate the top electrode 134 by etching back the encapsulation layer material 136. The encapsulation layers 138 are formed to protect the memory pillar (e.g., the memory stack 132) from conductive material that will be formed during subsequent processing. More specifically, the encapsulation layers 138 can be formed to a height along the top electrode 134. The encapsulation layers 138 can be formed to have a thickness depending on pitch. For example, the encapsulation layers 138 can be formed to have a thickness between, e.g., about 5 nm to about 250 nm, depending on the pitch. The encapsulation layers 138 can include any suitable material in accordance with the embodiments described herein. Examples of suitable materials that can be used to form the encapsulation layers 138 include, but are not limited to, a silicon oxide material (e.g., $SiO_2$), a silicon nitride material (e.g., SiN), a silicon carbonitride material (e.g., SiCN), a silicon oxynitride material (e.g., SiNO), a silicon carbide material (e.g., SiC), etc.

As further shown, after the encapsulation layer 138 are formed, an ILD layer 140 is formed at least up to the upper surface of the top electrode 134. The ILD layer 140 can be formed to a suitable height above the top electrode 134. More specifically, as will be described below with reference to FIG. 6, portions of the ILD layer 140 will be removed during a trench and via patterning process. Examples of materials that can be used to form the ILD layer 140 include, but are not limited to, low-k dielectric materials (e.g., ULK dielectric materials), TEOS, etc.

Figure 6:
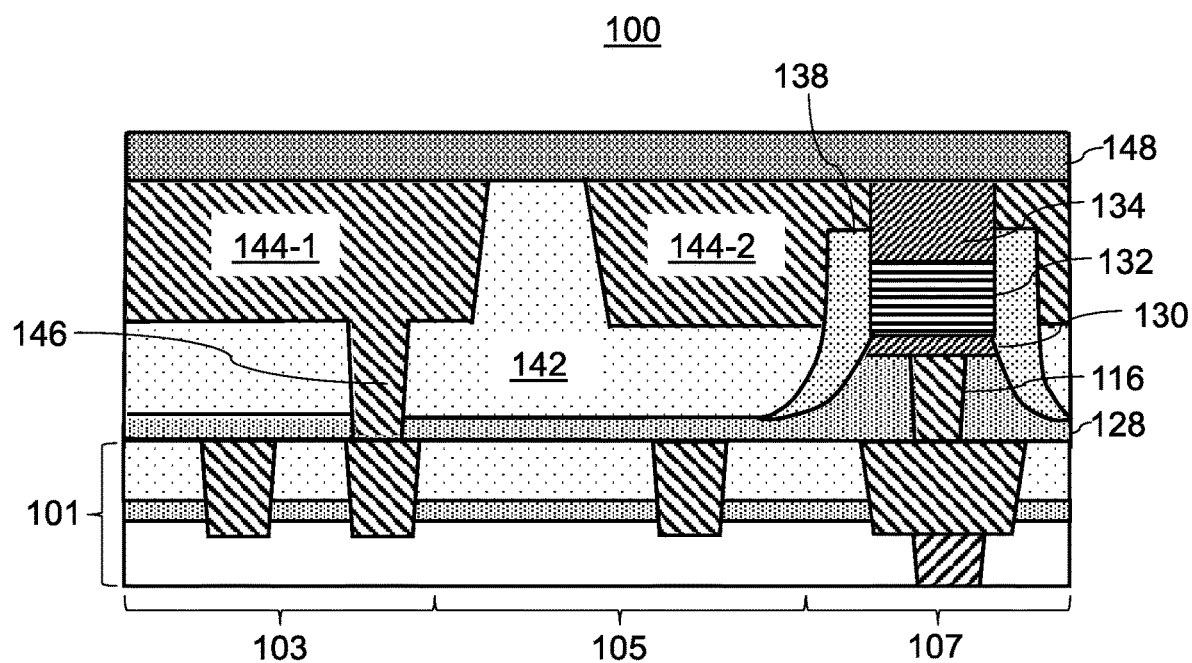
FIG. 6 is a cross-sectional view of additional processing performed during the fabrication of the semiconductor device, in accordance with an embodiment of the present invention.

With reference to FIG. 6, additional processing is performed to form the device 100. More specifically, a trench and via patterning process is performed to form trenches and a via opening within the ILD layer 140, resulting in patterned ILD layer 142, and conductive material is formed within the trenches and the via opening to form conductive lines 144-1 and 144-2 and a via 146. The conductive lines 144-1 and 144-2 are included within a second metallization level of the device 100. For example, a dual damascene trench formation process can be employed during the trench and via patterning process. Any suitable material can be used to form the conductive lines 144-1 and 144-2 and the via 146 in accordance with the embodiments described herein. Examples of materials that can be used to form the conductive lines 144-1 and 144-2 and the via 146 include, but are not limited to, copper (Cu), cobalt (Co), tungsten (W), ruthenium (Ru), aluminum (Al), etc.

As shown, the top electrode 134 is surrounded within the conductive line 144-2 during the formation of the second metallization level, and thus is positioned above the via 146. This ensures better contact between the top electrode 134 and the conductive line 144-2 to help eliminate the risk of high contact resistance (in contrast to only a surface of the top electrode 134 touching the conductive line 144-2), and enables the memory pillar to be fitted between the conductive lines of the first and second metallization levels.

As further shown, a cap layer 148 is formed across the conductive lines 144-1 and 144-2, the patterned ILD layer 142 and the top electrode 134. Any suitable material can be used to form the cap layer 148 in accordance with the embodiments described herein. Examples of materials that can be used to form the cap layer 148 include, but are not limited to, silicon (Si)-based oxides, Si-based nitrides, etc., which can include other elements such as, e.g., C, N, O, etc. For example, the cap layer 148 can include, e.g., silicon nitride (e.g., SiN), silicon carbonitride (e.g., SiCN), silicon oxynitride (e.g., SiNO), silicon carbide (e.g., SiC), etc.

FIGS. 1-6 provide for the formation of an embedded memory device (e.g., MRAM device) in accordance with one embodiment. FIGS. 7-12, described herein below, provide for the formation of a memory device 200 in accordance with another embodiment.

Figure 7:
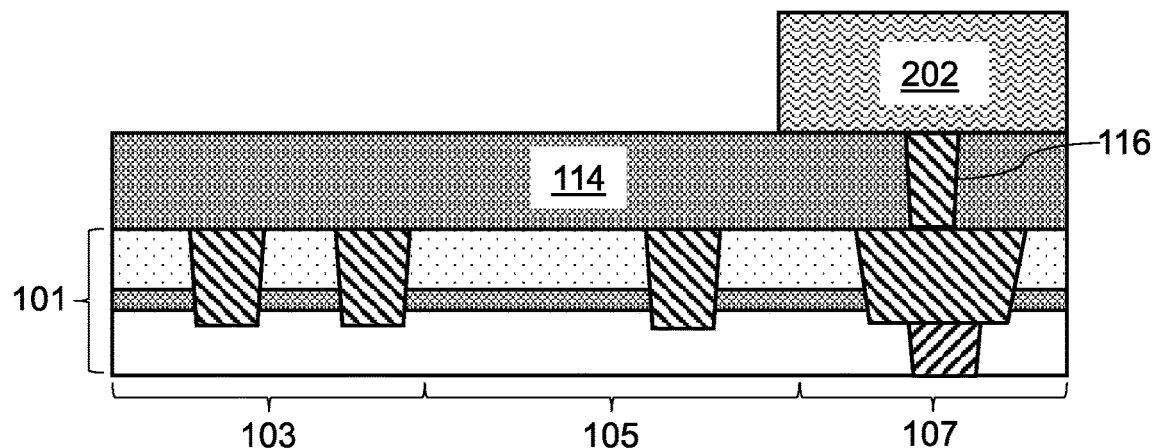
FIG. 7 is a cross-sectional view of the formation of a cap layer on a base structure of an embedded memory device and the formation of a block mask on the cap layer during the fabrication of a semiconductor device, in accordance with another embodiment of the present invention.

With reference to FIG. 7, a cross-sectional view of a semiconductor device 200 including an embedded memory device is provided. In one embodiment, the embedded memory device includes an embedded random-access memory (RAM) device. In this illustrative example, an embedded MRAM device is shown. However, the device 200 can include any suitable memory device technology in accordance with the embodiments described herein.

It is assumed in this embodiment that the device 200 includes the base structure 101, the cap layer 114 and the BEC 116 described above with reference to FIGS. 1-2.

As further shown, a block mask 202 is formed on the cap layer and the BEC 116. The block mask 202 will be used to pattern the cap layer 114, as will be described in further detail below with reference to FIG. 8. For example, the block mask 202 can include, e.g., a dielectric hardmask.

Figure 8:
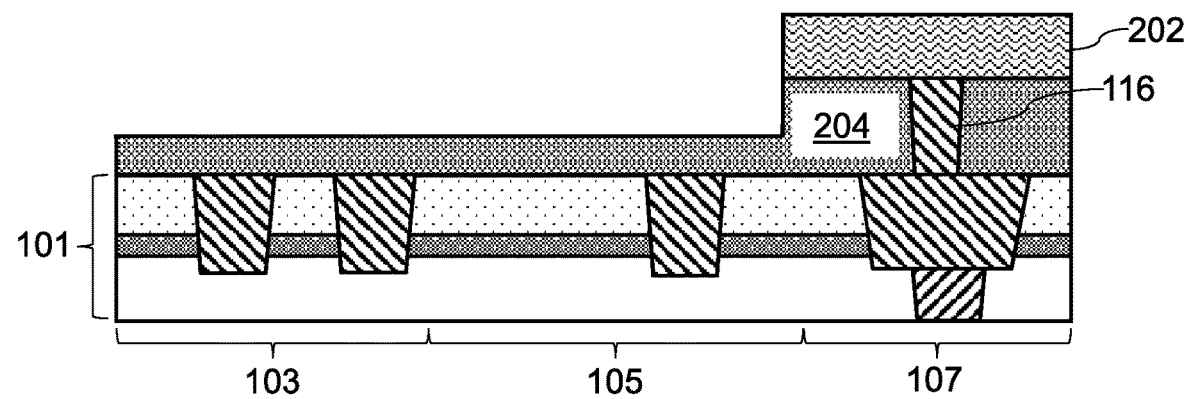
FIG. 8 is a cross-sectional view the patterning of the cap layer using the block mask to form a patterned cap layer, in accordance with another embodiment of the present invention.

With reference to FIG. 8, the cap layer 114 is patterned to form a patterned cap layer 204. Any suitable etch process can be used to pattern the cap layer 114 to form the patterned cap layer 204 in accordance with the embodiments described herein.

Figure 9:
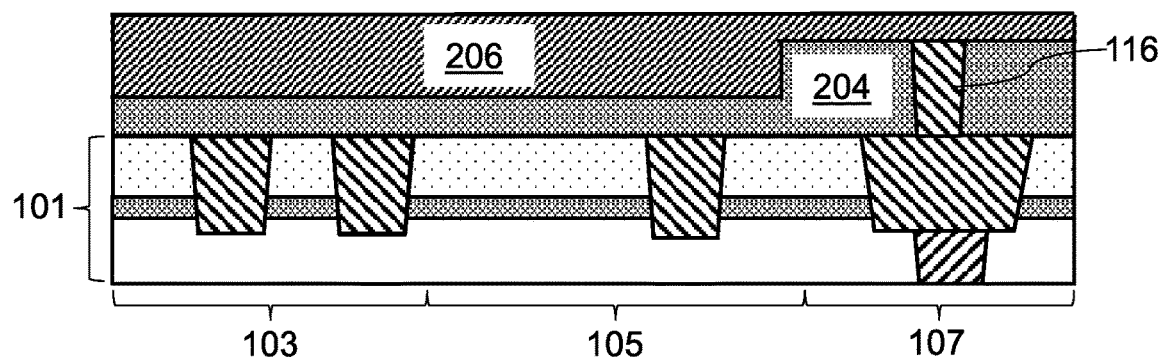
FIG. 9 is a cross-sectional view of the formation bottom electrode contact (BEC) material during the fabrication of the semiconductor device, in accordance with another embodiment of the present invention.

With reference to FIG. 9, the block mask 202 is removed and bottom electrode material 206 is formed across the device 200. The bottom electrode material 206 can include any suitable material in accordance with the embodiments described herein. Examples of materials that can be used to form the bottom electrode material 206 include, but are not limited to, tantalum nitride (TaN), titanium nitride (TiN), etc.

Figure 10:
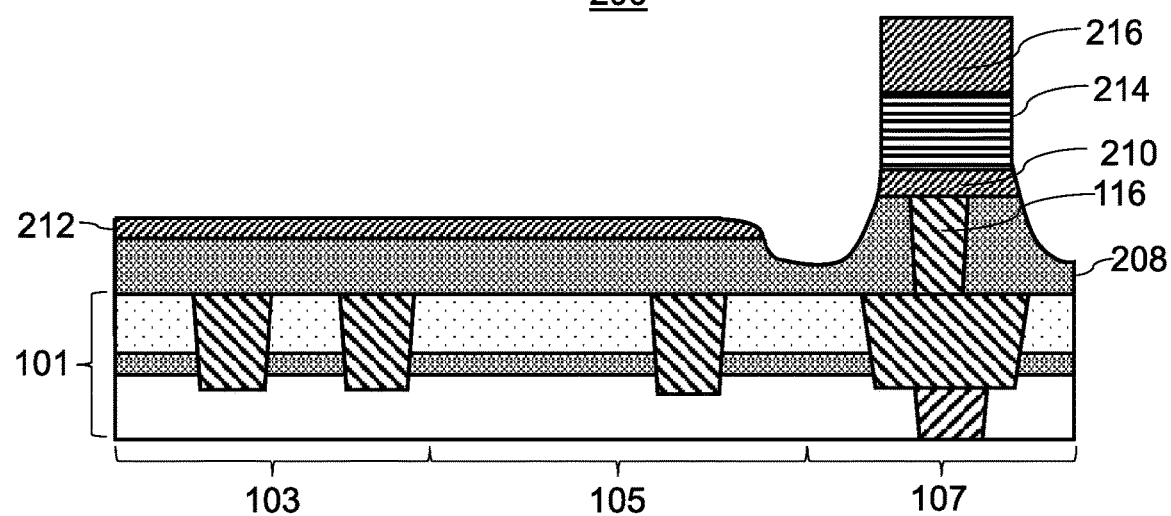
FIG. 10 is a cross-sectional view of patterning performed on the patterned cap layer, the BEC material, and a plurality of layers including a memory material stack, top electrode material during the fabrication of the semiconductor device, in accordance with another embodiment of the present invention.

With reference to FIG. 10, a modified patterned cap layer 208 is formed from the patterned cap layer 114, a bottom electrode 210 and remaining bottom electrode material 212 are formed from the bottom electrode material 206, a memory stack (e.g., MTJ stack) 214 is formed on the bottom electrode 210, and a top electrode 216 is formed on the memory stack 214. The components 210, 214 and 216 can collectively be referred to as a memory pillar. For example, in the embodiment in which the device 200 includes an MRAM device, the memory pillar is an MRAM pillar. Similar to the device 100 shown in FIG. 4, the modified patterned cap layer 208 is flat within the areas 103 and 105, and is sloped in the memory area 107. However, the slope in FIG. 10 is different from that shown in FIG. 4, in that there is a divot formed within the modified patterned conductive material 208. In order to avoid sputtering from the BEC 116 and redeposition on the memory pillar sidewall during IBE, the critical dimension of the bottom electrode 210 can be larger than the top critical dimension of the BEC 116.

The components 208 through 216 can be formed using any suitable process in accordance with the embodiments described herein. For example, similar to FIG. 3 described herein above, a plurality of layers can be formed on the bottom electrode material 206. More specifically, a memory material stack can be formed on the bottom electrode material 206, top electrode material can be formed on the memory material stack, a lithography stack can be formed on the top electrode material, and a block mask can be formed on the lithography material. Then, patterning is performed using the lithography stack and the block mask to form the components 208 through 216. The memory material stack, the top electrode material, the lithography stack and the block mask can include any suitable materials in accordance with the embodiments described herein (e.g., the same or similar materials as described above with reference to FIG. 3). Any suitable process can be used to perform the patterning (e.g., the same or similar processes as described above with reference to FIG. 4).

Figure 11:
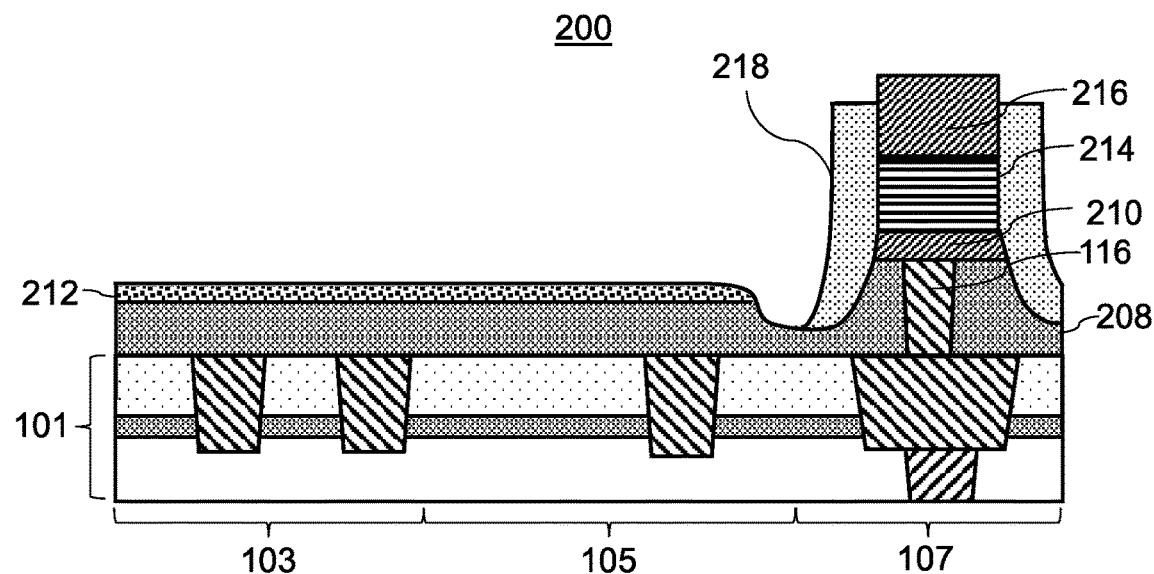
FIG. 11 is a cross-sectional view of the formation of encapsulation layers from encapsulation layer material during the fabrication of the semiconductor device, in accordance with another embodiment of the present invention.

With reference to FIG. 11, encapsulation layers 218 are formed to encapsulate the memory pillar. The encapsulation layers 218 protect the memory pillar (e.g., the memory stack 214) from conductive material formed during subsequent processing. The encapsulation layers 218 can be formed using any suitable process in accordance with the embodiments described herein. For example, similar to FIGS. 4-5, encapsulation layer material can be formed across the device 200, and the encapsulation layer material can be etched back to form the encapsulation layers 218. The encapsulation layer 218 can include any suitable material in accordance with the embodiments described herein. Examples of materials that can be used to form the encapsulation layers 218 include, but are not limited to, silicon nitride (e.g., SiN), silicon carbonitride (e.g., SiCN), silicon oxynitride (e.g., SiNO), silicon carbide (e.g., SiC), etc.

Figure 12:
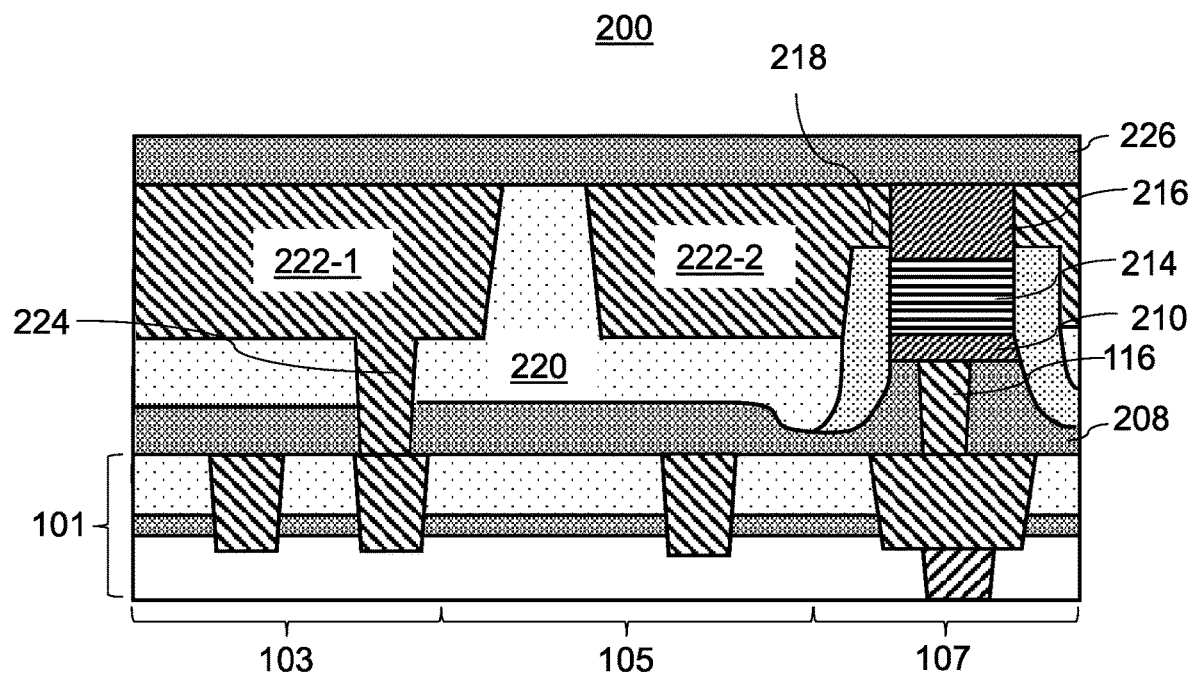
FIG. 12 is a cross-sectional view of additional processing performed during the fabrication of the semiconductor device, in accordance with another embodiment of the present invention.

With reference to FIG. 12, additional processing is performed to form the device 200. More specifically, the remaining bottom electrode material 212 is removed using a suitable etch process, a patterned ILD layer 220 is formed by forming an ILD layer and patterning the ILD layer to form trenches and a via opening within the ILD layer, conductive lines 222-1 and 222-2 and via 224 are formed by forming conductive material within the trenches and the via opening, and a cap layer 226 is formed across the conductive lines 222-1 and 222-2, the patterned ILD layer 220 and the top electrode 216. The conductive lines 221-1 and 222-2 and the via 224 are included within a second metallization level of the device 100.

As shown, the top electrode 216 is surrounded within the conductive line 222-2 during the formation of the second metallization level, and thus is positioned above the via 146. This ensures better contact between the top electrode 216 and the conductive line 222-2 to help eliminate the risk of high contact resistance (in contrast to only a surface of the top electrode 216 touching the conductive line 222-2), and enables the memory pillar to be fitted between the conductive lines of the first and second metallization levels.

Examples of materials that can be used to form the patterned ILD layer 220 include, but are not limited to, low-k dielectric materials, ULK dielectric material, TEOS, etc.

The conductive lines 222-1 and 222-2 are included within a second metallization level of the device 200. For example, a dual damascene trench formation process can be employed during the trench and via patterning process. Any suitable material can be used to form the conductive lines 222-1 and 222-2 and the via 224 in accordance with the embodiments described herein. Examples of materials that can be used to form the conductive lines 222-1 and 222-2 and the via 224 include, but are not limited to, copper (Cu), cobalt (Co), tungsten (W), ruthenium (Ru), aluminum (Al), etc.

Any suitable material can be used to form the cap layer 226 in accordance with the embodiments described herein. Examples of materials that can be used to form the cap layer 226 include, but are not limited to, silicon (Si)-based oxides, Si-based nitrides, etc., which can include other elements such as, e.g., C, N, O, etc. For example, the cap layer 226 can include, e.g., silicon nitride (e.g., SiN), silicon carbonitride (e.g., SiCN), silicon oxynitride (e.g., SiNO), silicon carbide (e.g., SiC), etc.

The embodiments described above with reference to FIGS. 1-6 and 7-12 provide for embedded memory devices (e.g., MRAM devices) in which the total height of the memory pillar (e.g., MRAM pillar) is greater than the spacing between the metallization levels. That is, the total height of the memory pillar is greater than the height of the via connecting the conductive lines of adjacent metallization levels. A given one of the conductive lines from the second metallization level contacts the top electrode at the sidewall and part of the memory pillar penetrates into the given conductive line. Encapsulation layers prevent the given conductive line from reaching into the memory stack.

Figure 13:
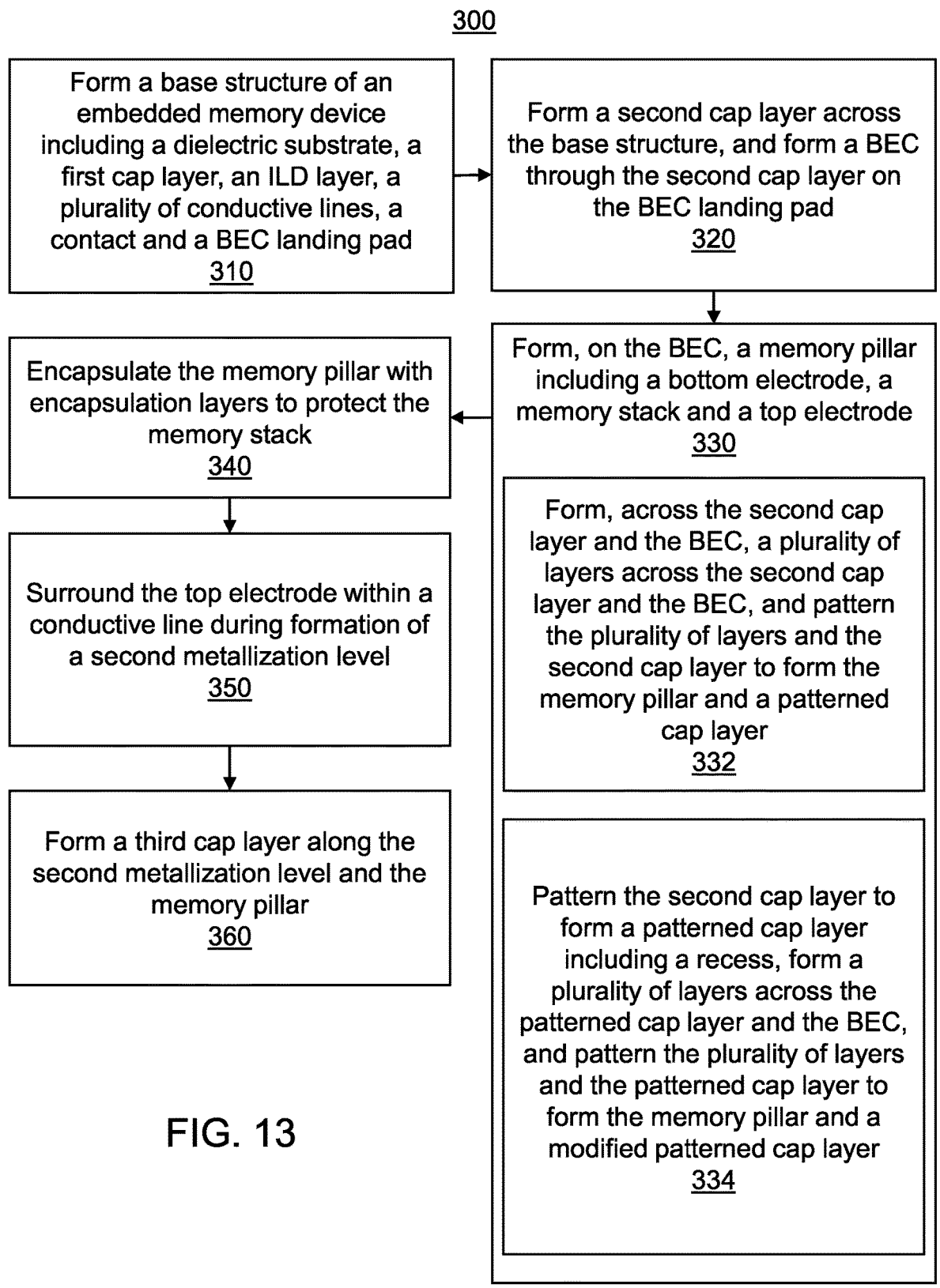
FIG. 13 is a block/flow diagram illustrating a system/method for fabricating a semiconductor device, in accordance embodiments of the present invention.

With reference to FIG. 13, a block/flow diagram is provided illustrating a system/method 300 for fabricating a semiconductor device.

At block 310, a base structure of an embedded memory device including a dielectric substrate, a first cap layer, an interlevel dielectric (ILD) layer, a plurality of conductive lines, a contact, and a bottom electrode contact (BEC) landing pad is formed. In one embodiment, the embedded memory device can include an MRAM device.

More specifically, the embedded memory device can include a logic area, a logic to memory boundary area and a memory area, and forming the base structure can include forming the first cap layer across the dielectric substrate, forming the first ILD layer across the cap layer, forming the plurality of first conductive lines from a height within the dielectric substrate to the upper surface of the first ILD layer in the logic area and logic to memory boundary area, forming the contact from the bottom surface of dielectric substrate to the height within the dielectric substrate in the memory area, and forming the BEC landing pad on the contact within the memory area to the upper surface of the first ILD layer. The contact connects the BEC landing pad to the underlying interconnect structure (e.g., middle-of-the-line (MOL) interconnect structure) or front-end-of-the-line (FEOL) devices such as, e.g., a transistor for switching memory devices. Further details regarding block 302 are described above with reference to FIG. 1.

At block 320, a second cap layer is formed across the base structure and a BEC is formed through the second cap layer on the BEC landing pad. Further details regarding block 320 are described above with reference to FIG. 2.

At block 330, memory pillar including a bottom electrode, a memory stack and a top electrode is formed on the BEC. In one embodiment, the memory stack includes a magnetic tunnel junction (MTJ) stack including MTJ memory material.

In one embodiment, forming the memory pillar at block 330 can include, at block 332, forming a plurality of layers across the second cap layer and the BEC, and patterning the plurality of layers and the second cap layer to form the memory pillar and a patterned cap layer. More specifically, forming the plurality of layers can include forming bottom electrode material on the second cap layer and the BEC, forming a memory material stack on the bottom electrode material, forming top electrode material on the memory material stack, forming a lithography stack on the top electrode material, and forming a photoresist pattern on the lithography stack.

The patterned cap layer is flat within the logic area and the logic to memory boundary area, and slopes upward to the bottom electrode of the memory pillar within the memory area. Any suitable patterning process can be used to form the memory pillar and the patterned cap layer in accordance with the embodiments described herein. For example, reactive-ion etching (RIE) and/or ion beam etching (IBE) can be used. In order to avoid sputtering from the BEC and redeposition on the memory pillar sidewall, the critical dimension of the bottom electrode can be larger than the top critical dimension of the BEC.

Further details regarding block 332 are described above with reference to FIG. 3.

In another embodiment, forming the memory pillar at block 330 can include, at block 334, patterning the second cap layer to form a patterned cap layer including a recess, forming a plurality of layers across the patterned cap layer and the BEC, and patterning the plurality of layers and the patterned cap layer to form the memory pillar and a modified patterned cap layer.

More specifically, patterning the second cap layer to form the patterned cap layer can include forming a block mask on the second cap layer and the BEC, removing the remaining portion of the block mask, and etching to form the recess to a height below the top surface of the second cap layer. Then, forming the plurality of layers can include forming bottom electrode material on the patterned cap layer, and then forming a memory material stack and top electrode material on the bottom electrode material.

The modified patterned cap layer is flat within the logic area, slopes down around the border of the logic to memory boundary area and the memory area, and slopes upward to the bottom electrode of the memory pillar within the memory area. A portion of the bottom electrode can remain on the modified patterned cap layer within the logic area and logic to memory boundary area. Any suitable patterning process can be used to form the memory pillar and the modified patterned cap layer in accordance with the embodiments described herein. For example, reactive-ion etching (RIE) and/or ion beam etching (IBE) can be used.

Further details regarding block 334 are described above with reference to FIGS. 7-10.

After the memory pillar is formed, at block 340, the memory pillar is encapsulated with encapsulation layers to protect the memory stack. More specifically, the encapsulation layers can be formed to a height along the top electrode. The encapsulation layers can be formed to have a thickness depending on pitch. For example, the encapsulation layers can be formed to have a thickness between, e.g., about 5 nm to about 250 nm, depending on the pitch. Forming the encapsulation layers can include conformally depositing encapsulation layer material, and etching back the encapsulation layer material to the height along the top electrode.

At block 350, the top electrode is surrounded within a conductive line during formation of a second metallization level. Surrounding the top electrode within a conductive line during the formation of the second metallization label enables the memory pillar to be fitted between the conductive lines of the first and second metallization levels.

More specifically, the formation of the second metallization level includes the formation of a plurality of conductive lines and at least one via. The at least one via connects one of the conductive lines of the first metallization level to a first conductive line of the second metallization level within the logic area of the embedded memory device. In the embodiment in which a portion of the bottom electrode material remains, the remaining portion of the bottom electrode material can be removed using a suitable etch process before the formation of the second metallization level.

Forming the second metallization level at block 350 can including forming a second ILD layer up to the upper surface of the memory pillar, obtaining a patterned ILD layer by forming a plurality of trenches and a via opening within the second ILD layer, and filling the trenches and the via opening with conductive material to form the second metallization level. The second ILD layer can be formed to a suitable height above the memory pillar to support the removal of portions of the second ILD layer during a subsequent trench and via patterning process.

Surrounding the top electrode within the conductive line ensures better contact between the top electrode and the conductive line to help eliminate the risk of high contact resistance (in contrast to only a surface of the top electrode touching the conductive line). Accordingly, the top electrode is positioned above the at least one via.

At block 360, a third cap layer is formed along the second metallization level and the memory pillar.

Further details regarding blocks 340-360 are described above with reference to FIGS. 4-6, 11 and 12.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
   forming a bottom electrode contact (BEC) on a BEC landing pad of a base structure of an embedded memory device, the base structure further including a first metallization level;
   forming, on the BEC, a memory pillar including a bottom electrode, a memory stack and a top electrode;
   encapsulating the memory pillar with encapsulation layers to protect the memory stack; and
   surrounding the top electrode within a second conductive line during formation of a second metallization level to enable the memory pillar to be fitted between the first and second metallization levels.

2. The method of claim 1, wherein the embedded memory device includes a magnetoresistive (MRAM) device, and the memory stack includes a magnetic tunnel junction (MTJ) stack.

3. The method of claim 1, wherein the base structure further includes:
   a dielectric substrate;
   a cap layer disposed on the dielectric substrate;
   an interlevel dielectric (ILD) layer disposed on the cap layer; and
   a contact having the BEC landing pad being disposed thereon.

4. The method of claim 1, further comprising:
   forming a cap layer across the base structure; and
   forming the BEC on the BEC landing pad through the cap layer.

5. The method of claim 4, wherein forming the memory pillar further includes:
   forming, across the cap layer and a via, a plurality of layers including bottom electrode material, a memory material stack and top electrode material; and
   patterning the cap layer and the plurality of layers to form a patterned cap layer and the memory pillar.

6. The method of claim 4, wherein forming the memory pillar further includes:
   patterning the cap layer to form a patterned cap layer including a recess;
   forming, across the patterned cap layer and the first via, a plurality of layers including bottom electrode material, a memory material stack and top electrode material; and
   patterning the patterned cap layer and the plurality of layers to form a modified patterned cap layer and the memory pillar.

7. The method of claim 6, wherein patterning the patterned cap layer and the plurality of layers further forms a remaining portion of the bottom electrode material disposed outside of the memory area, and wherein the remaining portion of the bottom electrode material is removed prior to forming the second metallization level.

8. The method of claim 1, wherein surrounding the top electrode within the second conductive line during formation of the second metallization level further includes:
   forming an interlevel dielectric (ILD) layer;
   obtaining a patterned ILD layer by forming a plurality of trenches and a via opening within the ILD layer; and
   filling the trenches and the via opening with conductive material to form the second conductive line, a via disposed on a first conductive line of the first metallization level within a logic area of the embedded memory device such that the via is below the top electrode, and a third conductive line disposed on the via.

9. The method of claim 8, further comprising forming a cap layer along the patterned ILD layer, the second metallization level and the memory pillar.

10. A method for fabricating a semiconductor device, comprising:

forming a cap layer across a base structure of an embedded memory device, the base structure including a bottom electrode contact (BEC) landing pad within a memory area of the embedded memory device and a first metallization level having a first conductive line within a logic area of the embedded memory device;

forming a bottom electrode contact (BEC) through the cap layer on the BEC landing pad;

forming, on the BEC and the cap layer, a memory pillar including a bottom electrode, a memory stack and a top electrode;

encapsulating the memory pillar with encapsulation layers to protect the memory stack;

obtaining a patterned interlevel dielectric (ILD) layer including a plurality of trenches and a via opening; and filling the plurality of trenches and the via opening with conductive material to form a second metallization level including a second conductive line surrounding the top electrode, a via disposed on the first conductive line such that the via is below the top electrode, and a second conductive line disposed on the first conductive line to enable the memory pillar to be fitted between the first and second metallization levels.

11. The method of claim 10, wherein the embedded memory device includes a magnetoresistive (MRAM) device, and the memory stack includes a magnetic tunnel junction (MTJ) stack.

12. The method of claim 10, wherein the base structure further includes:
a dielectric substrate;
a cap layer disposed on the dielectric substrate;
an ILD layer disposed on the cap layer; and
a contact having the BEC landing pad being disposed thereon.

13. The method of claim 10, wherein forming the memory pillar further includes:
forming, across the cap layer and the BEC, a plurality of layers including bottom electrode material, a memory material stack and top electrode material; and
patterning the cap layer and the plurality of layers to form a patterned cap layer and the memory pillar.

14. The method of claim 10, wherein forming the memory pillar further includes:
patterning the cap layer to form a patterned cap layer including a recess;
forming, across the patterned cap layer and a via, a plurality of layers including bottom electrode material, a memory material stack and top electrode material; and
patterning the patterned cap layer and the plurality of layers to form a modified patterned cap layer and the memory pillar.

15. The method of claim 14, wherein patterning the patterned cap layer and the plurality of layers further forms a remaining portion of the bottom electrode material disposed outside of the memory area, and wherein the remaining portion of the bottom electrode material is removed prior to forming the second metallization level.

16. The method of claim 10, further comprising forming a second cap layer along the patterned ILD layer, the second metallization level and the memory pillar.

17. A semiconductor device, comprising:
a base structure of an embedded memory device including a bottom electrode contact (BEC) landing pad within a memory area of the embedded memory device and a first metallization level having at least a first conductive line within a logic area of the embedded memory device;
a cap layer disposed on the base structure, the cap layer including a flat portion within the logic area and a sloped portion with the memory area;
a BEC disposed through the cap layer on the BEC landing pad;
a memory pillar disposed on the BEC and the cap layer including a bottom electrode, a memory stack and a top electrode;
encapsulation layers encapsulating the memory pillar to protect the memory stack; and
a second metallization level including a second conductive line surrounding the top electrode, a via disposed on the first conductive line such that the second via is below the top electrode, and a third conductive line disposed on the via to enable the memory pillar to be fitted between the first and second metallization levels.

18. The device of claim 17, wherein the embedded memory device includes a magnetoresistive (MRAM) device, and the memory stack includes a magnetic tunnel junction (MTJ) stack.

19. The device of claim 17, wherein the base structure further includes:
a dielectric substrate;
a second cap layer disposed on the dielectric substrate;
an ILD layer disposed on the second cap layer; and
a contact within the memory area, the BEC landing pad being disposed on the contact.

20. The device of claim 17, further comprising:
an ILD layer disposed on the cap layer between the second conductive line and the third conductive line; and
a second cap layer disposed across the second and third conductive lines, the ILD layer and the memory pillar.

* * * * *